United States Patent
Ko et al.

(10) Patent No.: US 10,103,113 B2
(45) Date of Patent: Oct. 16, 2018

(54) METHOD OF MANUFACTURING PRINTED CIRCUIT BOARD

(71) Applicant: DAEDUCK ELECTRONICS CO., LTD., Gyeonggi-do (KR)

(72) Inventors: Young-Joo Ko, Gyeonggi-do (KR); Tae-Hyuk Ko, Gyeonggi-do (KR); Hyeung-Do Lee, Gyeonggi-do (KR)

(73) Assignee: DAEDUCK ELECTRONICS CO., LTD., Gyeonggi-Do (KR)

( * ) Notice: Subject to any disclaimer, the term of this patent is extended or adjusted under 35 U.S.C. 154(b) by 231 days.

(21) Appl. No.: 15/172,279

(22) Filed: Jun. 3, 2016

(65) Prior Publication Data

US 2017/0243841 A1 Aug. 24, 2017

(30) Foreign Application Priority Data

Feb. 24, 2016 (KR) .......................... 10-2016-021772

(51) Int. Cl.
*H01L 23/00* (2006.01)
*H05K 3/40* (2006.01)
(Continued)

(52) U.S. Cl.
CPC ........... *H01L 24/03* (2013.01); *H05K 3/0026* (2013.01); *H05K 3/0035* (2013.01);
(Continued)

(58) Field of Classification Search
CPC . H01L 24/03; H01L 2224/0347; H01L 24/48; H01L 2224/16145;
(Continued)

(56) References Cited

U.S. PATENT DOCUMENTS 5,219,787 A * 6/1993 Carey .................. H05K 3/4644
257/E21.257
5,233,133 A * 8/1993 Iwasaki .................. H05K 3/429
174/250
(Continued)

FOREIGN PATENT DOCUMENTS

JP 2009-302563 A 12/2009
JP 2012146983 A * 8/2012
(Continued)

OTHER PUBLICATIONS

Official Action received in U.S. Appl. No. 15/172,454 dated Feb. 23, 2018.

*Primary Examiner* — A. Dexter Tugbang
(74) *Attorney, Agent, or Firm* — Ajay A. Jagtiani; Miles & Stockbridge P.C.

(57) ABSTRACT

A step of forming bump pads on the surface of the substrate corresponding to the cavity region, and covering the whole surface with a second insulating layer, forming a copper barrier on the surface of a second insulating layer corresponding to the cavity region for protection of the second insulating layer, forming a third insulating layer, and forming a copper layer for electrical circuit. A mask is formed on the copper later of the external circuit so that only the cavity region is exposed. The cavity is formed by laser-drilling only the surface-exposed area of the third insulating layer. The bottom copper layer protects the second insulating layer and bump pads underneath from laser damages. The copper barrier is removed by chemical etch after the laser drill. The second insulating layer with the bottom surface exposed will be removed via sand blast process, exposing the bump pads fabricated.

1 Claim, 9 Drawing Sheets

(51) Int. Cl.
*H05K 3/46* (2006.01)
*H05K 3/42* (2006.01)
*H05K 3/00* (2006.01)
*H05K 3/10* (2006.01)
*H05K 1/18* (2006.01)

(52) U.S. Cl.
CPC ......... *H05K 3/0073* (2013.01); *H05K 3/0079* (2013.01); *H05K 3/10* (2013.01); *H05K 3/40* (2013.01); *H05K 3/4038* (2013.01); *H05K 3/4061* (2013.01); *H05K 3/429* (2013.01); *H05K 3/4644* (2013.01); *H05K 3/4679* (2013.01); *H05K 3/4697* (2013.01); *H01L 24/48* (2013.01); *H01L 2224/0347* (2013.01); *H01L 2224/16145* (2013.01); *H01L 2224/48091* (2013.01); *H01L 2224/48227* (2013.01); *H01L 2224/73257* (2013.01); *H01L 2924/00014* (2013.01); *H01L 2924/181* (2013.01); *H05K 1/182* (2013.01); *H05K 2201/10674* (2013.01); *H05K 2203/025* (2013.01); *H05K 2203/107* (2013.01); *Y10T 29/4913* (2015.01); *Y10T 29/49165* (2015.01); *Y10T 29/49169* (2015.01)

(58) Field of Classification Search
CPC . H01L 2224/48097; H01L 2224/48227; H01L 2224/73257; H01L 2924/00014; H01L 2924/181; Y10T 29/4913; Y10T 29/49165; Y10T 29/49169; H05K 3/0026; H05K 3/0073; H05K 3/10; H05K 3/40; H05K 3/4038; H05K 3/4061; H05K 3/429; H05K 3/4644; H05K 3/4679; H05K 3/4697; H05K 3/0035; H05K 3/0079; H05K 1/182; H05K 2201/10674; H05K 2203/025; H05K 2203/107

See application file for complete search history.

(56) References Cited

U.S. PATENT DOCUMENTS

| | | | |
|---|---|---|---|
| 5,433,000 A | 7/1995 | Tamura et al. | |
| 2004/0217455 A1* | 11/2004 | Shiono | H05K 3/4061 257/678 |
| 2008/0289865 A1 | 11/2008 | Nakamura et al. | |
| 2010/0025087 A1 | 2/2010 | Takahashi | |
| 2012/0319254 A1 | 12/2012 | Kikuchi et al. | |
| 2014/0367155 A1* | 12/2014 | Huang | H05K 3/4697 174/260 |
| 2015/0156880 A1* | 6/2015 | Daizo | H05K 3/4697 174/251 |

FOREIGN PATENT DOCUMENTS

| | | |
|---|---|---|
| KR | 139273 | 2/1998 |
| KR | 10-2013-0096381 | 8/2013 |
| KR | 101580472 | 12/2015 |

\* cited by examiner

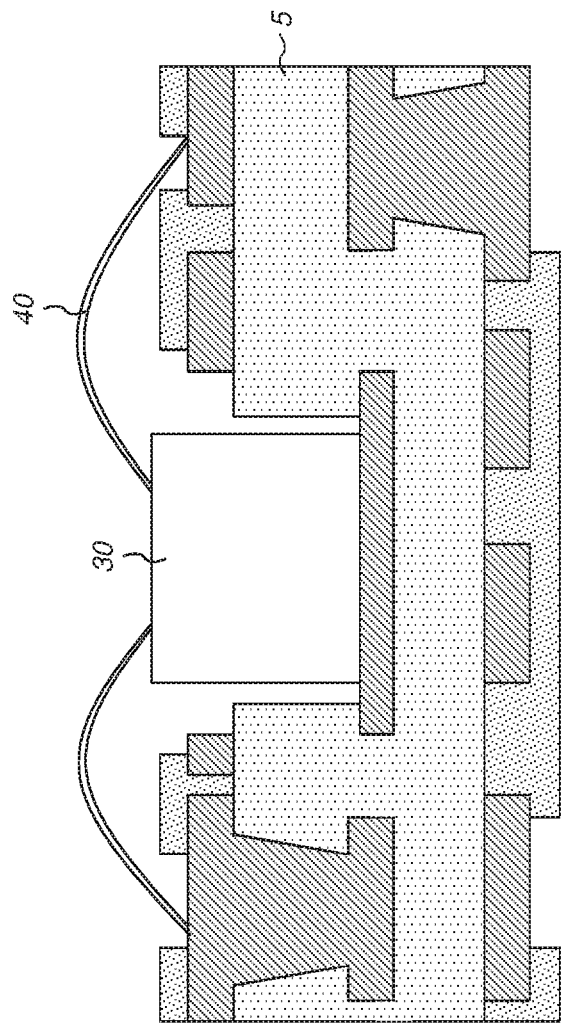

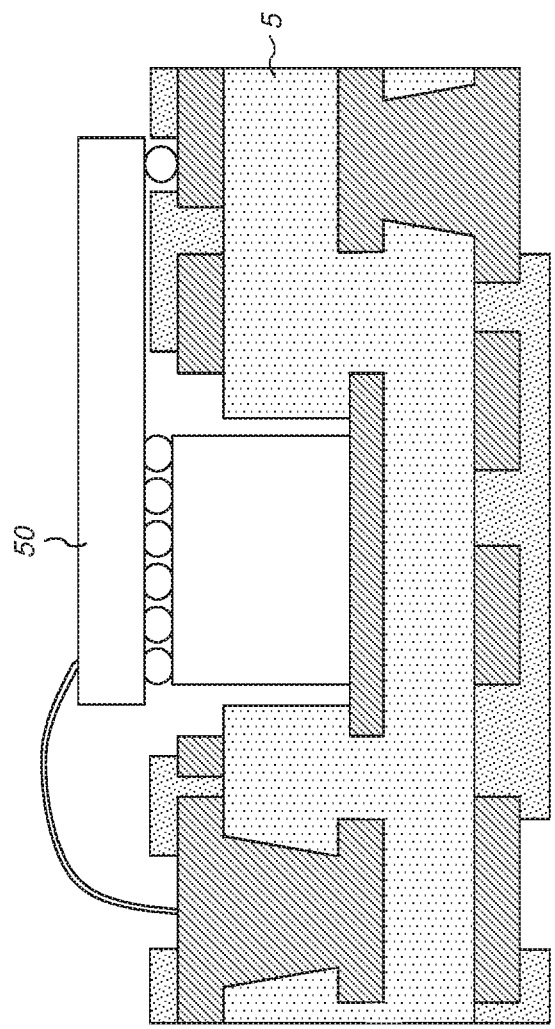

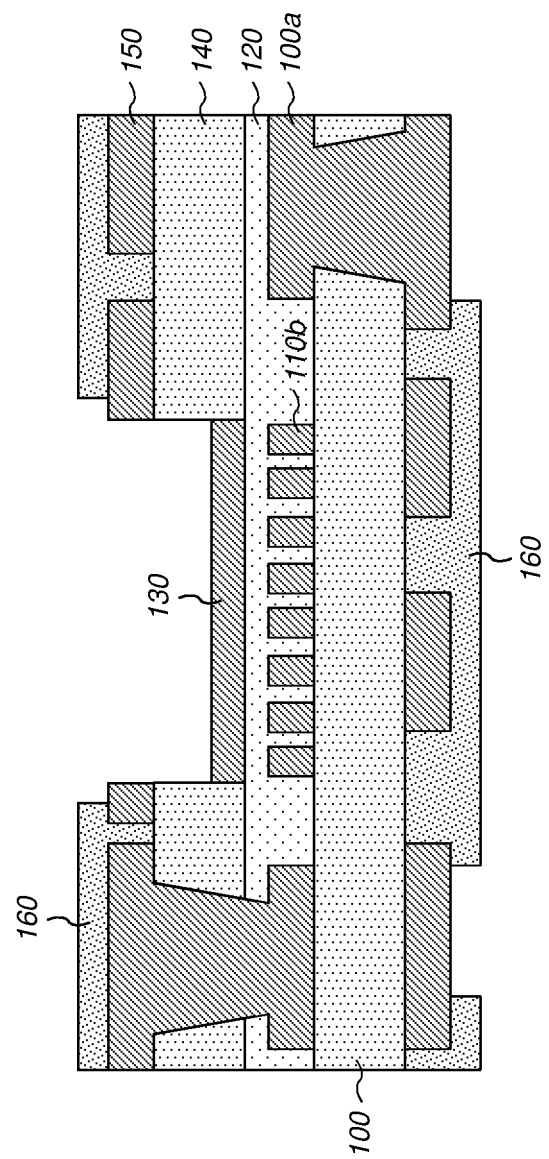

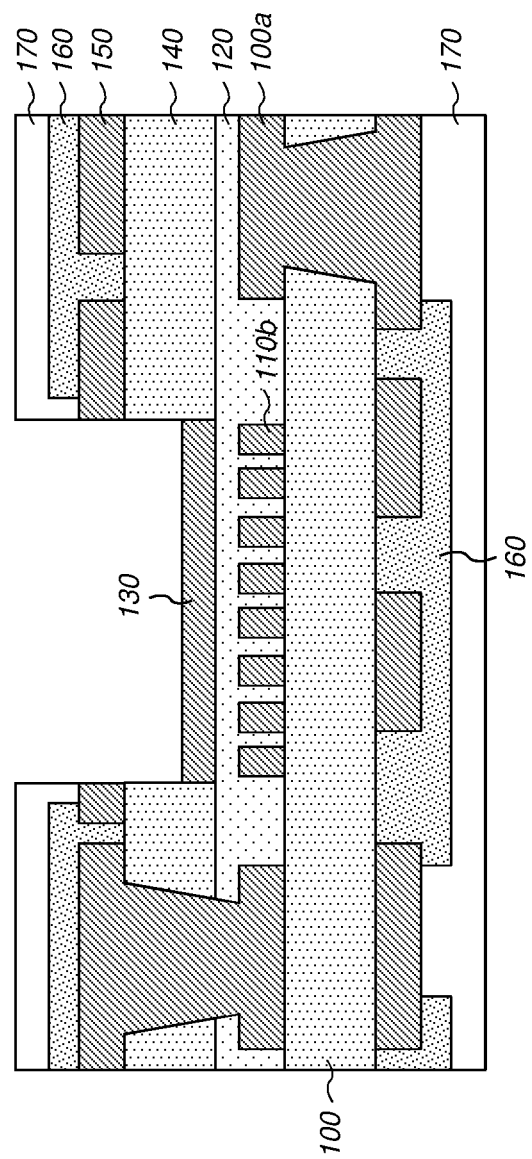

METHOD OF MANUFACTURING PRINTED CIRCUIT BOARD

CROSS REFERENCE TO RELATED APPLICATION

This application claims priority under 35 USC § 119 to Korean Patent Application No. 10-2016-021772, filed on Feb. 24, 2016, the contents of which are incorporated herein by reference in their entirety. The list of the prior art is the following: Korean Patent Publication No. 10-2013-0096381, Korean Patent No. 139,273, Korean Patent No. 101,580,472.

FIELD OF THE INVENTION

The present invention relates to a method of manufacturing a Cavity for mounting and/or embedding a chip on the Printed Circuit Board (PCB) and more particularly a method of fabricating the bump pads on the bottom surface of the cavity which is the place not just for embedding and fixing the chip but for making electrical contacts like flip-chip contacts.

BACKGROUND OF THE INVENTION

Recently, a great deal of research and development (R&D) efforts are made on the semiconductor package. The conventional 2D (two-dimensional) package technology is now stepping forward to 2.5-D (two and a half-dimensional) or 3-D (three-dimensional) package technology. The R&D trend moves to the direction of utilizing both the inside of the substrate and the 3-D space above the substrate from the conventional technology of embedding the chip only on the board.

The embedding technology attracts a great deal of attention in the leading-edge PCB industry because it reduces the packaging space and efficiently integrates the die stack.

FIGS. 1a, 1b, and 1c are diagrams illustrating the cavity wherein the semiconductor chip is embedded according to the prior art.

Referring to FIGS. 1a and 1b, we need to perform a laser drill on the PREPREG 5 in order to fabricate a cavity 10 in accordance with the prior art. Since the bottom surface of the cavity tends to be inevitably non-flat when the laser drill is applied, it is not easy to directly mount the semiconductor chip 30 on the bottom surface of the cavity. In order to resolve this problem, a copper layer 20 is prepared on the PREPREG in order to avoid damage on the surface of the PREPREG during the laser drill.

In other words, it is difficult to mount the semiconductor chip on the surface of the cavity due to the failure of surface flatness if the bottom surface of the cavity is severely damaged during the laser drill.

However, if you mount the semiconductor chip 30 on the copper barrier according to the prior art, you may succeed to embed the chip 30 just inside the cavity, but failed to make direct electrical contacts such as flip-chip bonding between the chip electrodes and the pads on the package substrate. Therefore, the prior art relies on the wire bonding technology between the pad of the upper surface of the chip and the pads on the package substrate.

Recently, the number of I/O terminals has so tremendously increased that we will need a huge number, therefore a huge area for bonding pads if we adopt only the wire bonding technology, which will consequently increase the package size as well as the packaging cost. Furthermore, as shown in FIG. 1c, if you want to realize a die stack, it is more difficult to make electrical contacts.

Therefore, it is urgently needed to make flip-chip bonding possible by preparing the bump pads on the bottom surface of the cavity. We can think about a method of coating the etch mask on the copper barrier 20 and making bump pads by the selective etch. However, this method is not recommended because the bump pads are easily peeled off due to the non-uniformity of resin etching between the pads as well as non-uniformity in the resin depth of the bump.

SUMMARY OF THE INVENTION

Accordingly, the goal of the present invention is to provide a method of fabricating a bump pad for flip-chip bonding inside the cavity for the printed circuit board (PCB).

Another goal of the present invention is to provide a method of mounting a die stack inside the cavity for the printed circuit board (PCB).

The present invention comprises a step of forming bump pads on the surface of the substrate corresponding to the cavity region, and covering the whole surface with a second insulating layer (i.e., resin without fiber glass, which is removable via sand blast process), forming a copper barrier on the surface of a second insulating layer corresponding to the cavity region for the protection of the second insulating layer, and forming a third insulating layer (i.e., PREPREG), and forming a copper layer for electrical circuit.

Thereafter, a mask is formed on the copper later of the external circuit in such a way that only the region for the cavity is exposed. The cavity is then formed by laser-drilling only the surface-exposed area of the third insulating layer. In this case, the copper layer at the bottom protects the second insulating layer and bump pads underneath from the laser damages. The copper barrier is now removed by chemical etch once the laser drill is over. The second insulating layer with bottom surface exposed will be removed via sand blast process, thereby exposing the bump pads which have been fabricated in the earlier steps.

This invention makes it possible to make direct electrical contacts of the semiconductor chip such as flip-chip bonding at the bottom surface of the cavity, which thereby enhances the integrating density as well as the reduction of the manufacturing cost.

BRIEF DESCRIPTION OF THE DRAWINGS

FIGS. 1a, 1b, and 1c are diagrams illustrating the cavity wherein the semiconductor chip is embedded according to the prior art.

DETAILED DESCRIPTION OF THE INVENTION

Detailed descriptions will be made on preferred embodiments and constitutional features of the fabricating method in accordance with the present invention with reference to attached figures from FIG. 2a to FIG. 2f.

The starting material in accordance with a preferred embodiment of the present invention is a structure comprising a first insulating layer such as resin or epoxy resin, of which the surface is coated with a copper layer. As a preferred embodiment of the present invention, a CCL (copper cladded laminate) or carrier copper can be utilized for coreless process.

Figure 1A:
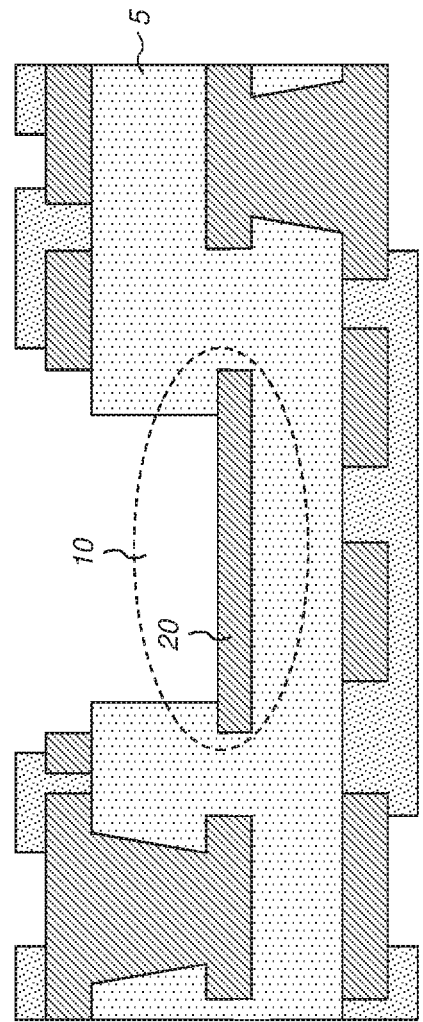
Figure 2A:
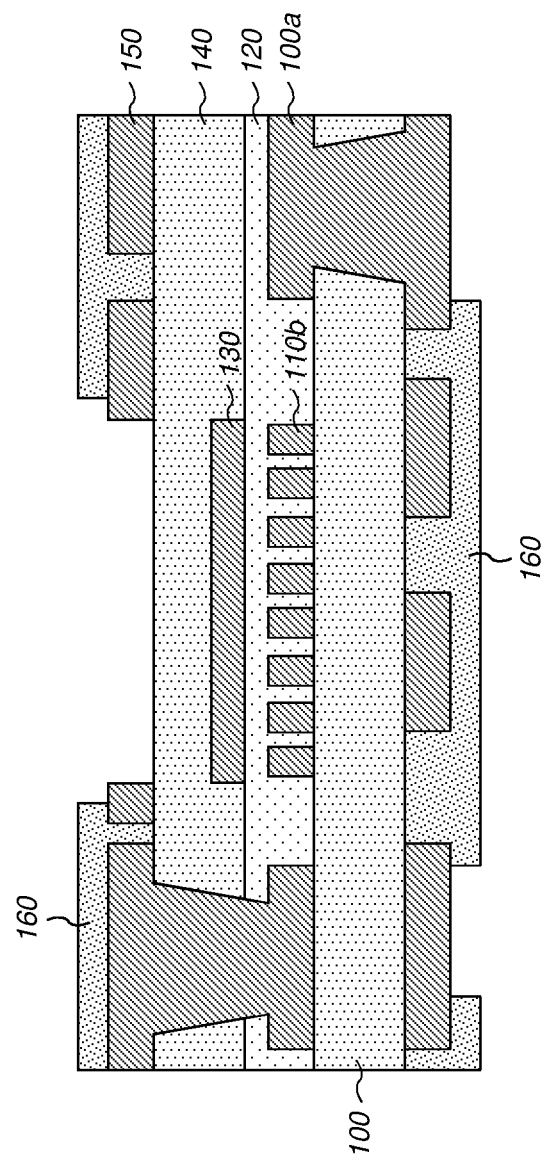
FIGS. 2a through to 2f are schematic diagrams which illustrate the cavity manufacturing process in accordance with the invention.

FIG. 2a is a schematic diagram illustrating the intermediate step of manufacturing the package substrate in accordance with the present invention. Referring to FIG. 2a, a first copper layer with circuit pattern transferred is formed on the surface of the first insulating layer 100. By processing the image process comprising dry film coating, exposure, development, and etch, a general circuit 110a and a bump pad 110b are simultaneously formed on the surface of the first insulating layer 100.

A second insulating layer and a second copper layer are stacked on the layer comprising the general circuitry 110a and the bump pad 110b. As a preferred embodiment of the second insulating layer, it is recommended to employ a special resin not having glass fibers but only with pillars. Since the second insulating layer in accordance with the present invention does not include glass fibers, it is possible to etch the second insulating layer with a sand blast process.

Now a copper barrier 130 is formed by selectively etching the second copper layer in accordance with the pre-determined circuit pattern. Approximately, the region wherein the copper barrier 130 remains to exist after the selective etch works corresponds to a cavity area. Thereafter, a third insulating layer 140 of resin or of general epoxy resin is coated. As a preferred embodiment of the third insulating layer, PREPREG can be used.

Here, we should note that the second insulating layer 130 can be etched away during the sand blast etching process while the third insulating layer 140 is not vulnerable during the sand blast etching process due to the fact that the third insulating layer 140 includes the fiber glasses. If needed, via-holes can be made for interconnections, followed by electroplating for making the external electrical circuit.

Referring to FIG. 2a, we can see that the copper circuit 150 comprising the external layer of the substrate exposes the surface of the third insulating layer 140 corresponding to the cavity area while the other area is covered with a protection layer 160 such as the solder resist.

Referring to FIG. 2b, we open a cavity by laser ablation at the exposed surface of the third insulating layer. In this case, the bottom copper layer 130 protects the underneath layer from being damaged during the laser ablation.

Figure 2D:
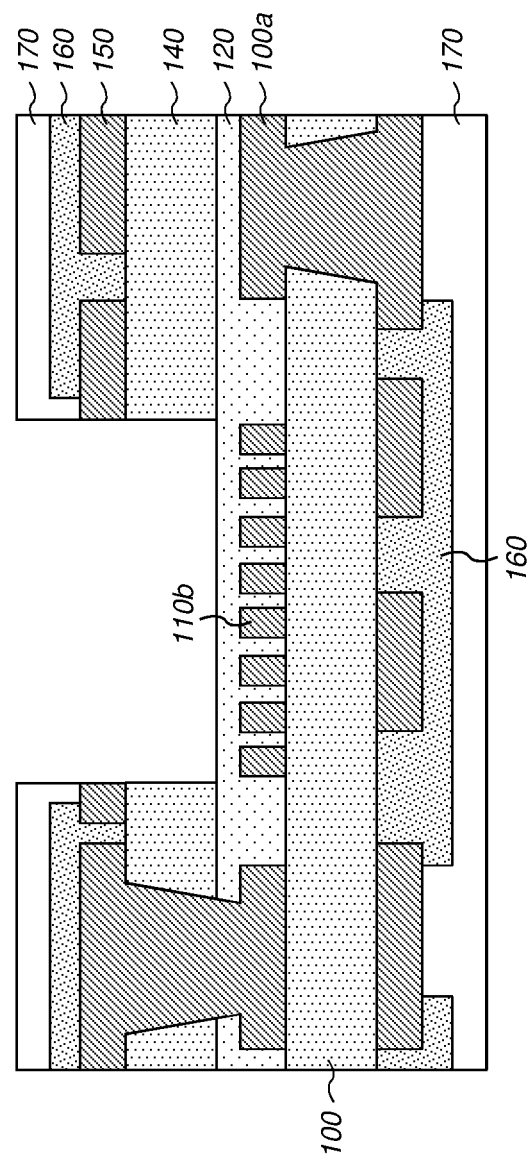

Thereafter, referring to FIG. 2c, we coat a mask layer such as dry film and prepare an etch mask 170 via imaging process like photo, development, and etch in such a way that the copper barrier 130 as well as the cavity region should be selectively exposed. Now, the copper barrier 130 while the other surface area is covered with the etch mask 170 can be removed by chemical wet etch. FIG. 2d is a diagram illustrating the cross sectional view of the substrate when the second insulating layer is exposed after the copper barrier 130 is eliminated.

Figure 2E:
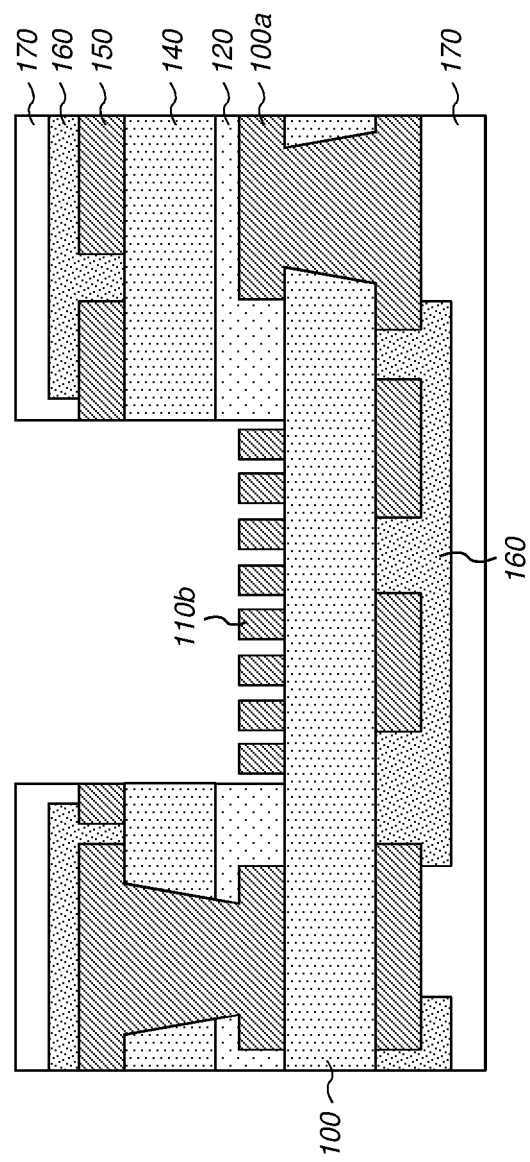
Figure 2F:
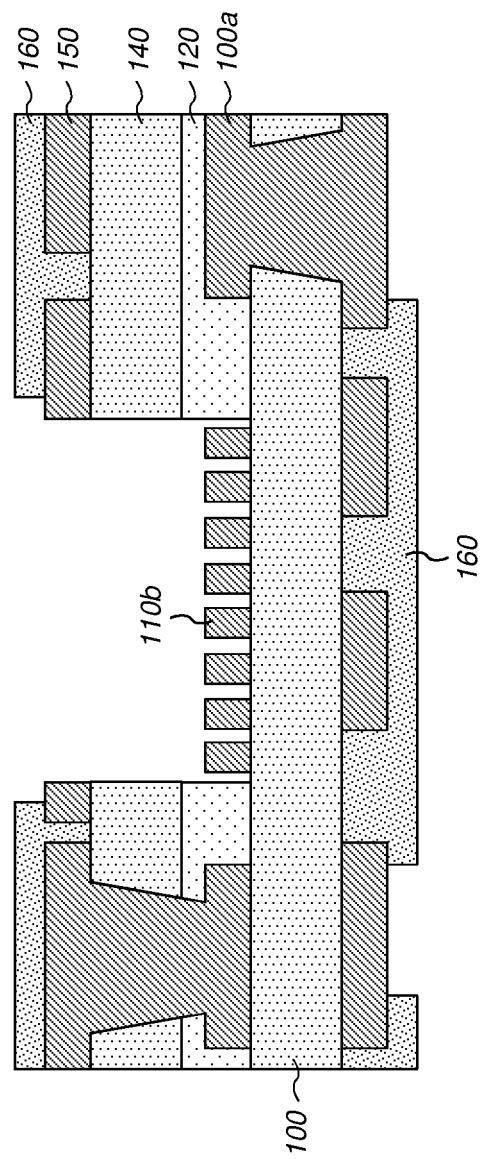

Referring to FIG. 2e, the second insulating layer 130 of which the surface is exposed by the etch mask window 170 is now removed via sand blast process. Consequently, the bump pad 110b at the bottom surface of the cavity is now exposed on the first insulating layer 100. Referring to FIG. 2f, the etch mask 170 is peeled off.

Finally, referring to FIG. 2f, we can see that we have bump pads 110b which can be used for flip-chip bonding.

The aforementioned somewhat widely improves the characteristics and technical advantages of the present invention so that the scope of the invention to be described later can be more clearly understood. The additional characteristics and technical advantages that constitute the scope of the present invention will be described below. The features that the disclosed concept and specific embodiments of the present invention can be instantly used as a basis designing or correcting other structure for accomplishing a similar object with the present invention should be recognized by those skilled in the art.

Further, it will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of fabricating a printed circuit board having a cavity for embedding a chip wherein electrodes of said chip are electrically connected to bump pads which are formed on a bottom surface of the cavity, comprising the steps of:
    (a) forming a first copper layer with a first circuit pattern transferred including the bump pads on a first insulating layer of the printed circuit board at a location corresponding to the cavity;
    (b) forming a second insulating layer and then a second copper layer on a top surface of the first copper layer, wherein the second insulating layer is made of material having no glass fiber so that the second insulating layer is removable through a sand blast process, and wherein the second copper layer is on a top surface of the second insulating layer;
    (c) forming a copper barrier on the top surface of the second insulating layer at a location corresponding to the cavity that is going to be made by selectively etching the second copper layer in accordance with a second circuit pattern, whereby the top surface of the second insulating layer is covered with the copper barrier and a portion of the second copper layer not being etched;
    (d) forming a third insulating layer on top of the portion of the second copper layer not being etched and on a surface of the copper barrier;
    (e) forming a third copper layer with a third circuit pattern transferred on top of the third insulating layer;
    (f) selectively etching and removing a portion of the third copper layer and a portion of the third insulating layer at a location corresponding to the cavity via a laser drill, thereby forming an opening where the copper barrier is exposed at a bottom of the opening, wherein the opening is a part of the cavity;
    (g) selectively coating a portion of the third copper layer that is not removed via the laser drill with an etch mask such that the copper barrier is not protected by the etch mask and an uncoated surface of the third insulating layer corresponds to a wall of the cavity;
    (h) selectively eliminating the copper barrier of which a surface of the copper barrier is exposed and not protected by the etch mask with a chemical etching solution, thereby exposing a portion of a surface of the second insulating layer at the bottom of the opening;
    (i) selectively etching and removing a portion of the second insulating layer of which a surface is of the second insulating layer exposed through the sand blast process, thereby forming the cavity having a bottom surface on the first insulating layer, wherein the bump pads that are formed on the first insulating layer are exposed at the bottom of the opening that is part of the cavity.

\* \* \* \* \*